(12) United States Patent
Obara

(10) Patent No.: US 9,449,910 B2
(45) Date of Patent: Sep. 20, 2016

(54) STRESS RELIEF LAYOUT FOR HIGH POWER SEMICONDUCTOR PACKAGE

(71) Applicant: Mitsubishi Electric Corporation, Tokyo (JP)

(72) Inventor: Taichi Obara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/726,006

(22) Filed: May 29, 2015

(65) Prior Publication Data

US 2016/0079152 A1    Mar. 17, 2016

(30) Foreign Application Priority Data

Sep. 11, 2014 (JP) .................................. 2014-184786

(51) Int. Cl.
| H01L 23/498 | (2006.01) |
| H01L 23/367 | (2006.01) |
| H01L 29/16 | (2006.01) |
| H01L 23/00 | (2006.01) |

(52) U.S. Cl.
CPC ..... *H01L 23/49838* (2013.01); *H01L 23/3675* (2013.01); *H01L 23/49866* (2013.01); *H01L 23/49894* (2013.01); *H01L 29/1608* (2013.01); *H01L 23/562* (2013.01)

(58) Field of Classification Search
None
See application file for complete search history.

(56) References Cited

U.S. PATENT DOCUMENTS

| 5,403,651 A * | 4/1995 | Miyagi | ............... H01L 21/4839 428/209 |
| 2008/0290498 A1* | 11/2008 | Mori | ..................... H01L 23/367 257/712 |
| 2013/0020672 A1* | 1/2013 | Tipton | ................... H01L 25/072 257/496 |
| 2014/0042609 A1* | 2/2014 | Nagaune | ................. H01L 24/34 257/692 |
| 2014/0048918 A1* | 2/2014 | Nagaune | ............. H01L 23/4334 257/675 |
| 2015/0179540 A1* | 6/2015 | Yasui | ...................... H01L 23/34 257/712 |

FOREIGN PATENT DOCUMENTS

| JP | 2005-11862 A | | 1/2005 |
| JP | 2005011862 A | * | 1/2005 |
| JP | 2009094135 A | * | 4/2009 |

OTHER PUBLICATIONS

Lin, T-H., Et. al. "Low Cost Direct Bonded Aluminum (DBA) Substrates", 2012 Vehicle Technologies Annual Merit Review and Peer Evaluation Meeting, Arlington VA, May 15, 2012.*
Machine translation of JP 2005-011862.*

* cited by examiner

*Primary Examiner* — Joseph Schoenholtz
(74) *Attorney, Agent, or Firm* — Studebaker & Brackett PC

(57) ABSTRACT

A semiconductor device according to the present invention includes: an insulating substrate; a circuit pattern having a first surface that is bonded to a first main surface of the insulating substrate and a second surface opposite to the first surface on which a semiconductor element is bonded; a back surface pattern having a first surface that is bonded to a second main surface of the insulating substrate; and a heat dissipation plate bonded to a second surface of the back surface pattern opposite to the first surface of the back surface pattern. A curvature of a corner portion of the circuit pattern is greater than a curvature of a corner portion of the back surface pattern, and the corner portion of the circuit pattern is located inside the corner portion of the back surface pattern in a plan view.

20 Claims, 6 Drawing Sheets

STRESS RELIEF LAYOUT FOR HIGH POWER SEMICONDUCTOR PACKAGE

BACKGROUND OF THE INVENTION

1. Field of the Invention

The present invention relates to a semiconductor device, and more particularly, to a semiconductor device including an insulating substrate.

2. Description of the Background Art

A manufacturing process of a semiconductor device including semiconductor elements disposed on a circuit pattern formed on an insulating substrate includes a step of bonding the insulating substrate to a heat dissipation plate. When the insulating substrate (member that is a ceramic plate including metal patterns bonded onto both sides thereof) is bonded to, for example, the heat dissipation plate with solder, thermal stress upon the solder bonding generates tensile stress in the insulating substrate, resulting in a crack in the insulating substrate. The thermal stress is generated and concentrated in pattern end portions in four corners of the insulating substrate.

As an example of conventional measures against the thermal stress, Japanese Patent Application Laid-Open No. 2005-11862 discloses a technology of forming a front pattern and a rear pattern of the metal pattern into a set pattern.

The technology in Japanese Patent Application Laid-Open No. 2005-11862 can reduce the thermal stress generated in the insulating substrate. However, to improve yields of the product, the thermal stress needs to be further reduced.

SUMMARY OF THE INVENTION

It is an object of the present invention to provide a semiconductor device capable of further reducing thermal stress generated in an insulating substrate to further suppress a generation of a crack.

A semiconductor device according to the present invention includes an insulating substrate and a circuit pattern having a first surface that is bonded to a first main surface of the insulating substrate and a second surface opposite to the first surface on which a semiconductor element is bonded. The semiconductor device further includes a back surface pattern having a first surface that is bonded to a second main surface of the insulating substrate and a heat dissipation plate bonded to a second surface of the back surface pattern opposite to the first surface of the back surface pattern. A curvature of a corner portion of the circuit pattern is greater than a curvature of a corner portion of the back surface pattern, and the corner portion of the circuit pattern is located inside the corner portion of the back surface pattern in a plan view.

In the semiconductor device according to the present invention, the curvature of the corner portion of the circuit pattern is greater than the curvature of the corner portion of the back surface pattern, and the circuit pattern is located inside the back surface pattern in the corner portion in the plan view. This configuration can reduce the thermal stress generated and concentrated in the corner portion of the insulating substrate more than a case where offset lengths of the circuit pattern and the back surface pattern are zero. This can further suppress the crack generated in the insulating substrate. Moreover, yields in manufacturing steps are improved. Furthermore, the crack resistance of the insulating substrate is increased, thereby increasing reliability of the semiconductor device.

These and other objects, features, aspects and advantages of the present invention will become more apparent from the following detailed description of the present invention when taken in conjunction with the accompanying drawings.

DESCRIPTION OF THE PREFERRED EMBODIMENTS

<First Preferred Embodiment>

Figure 1:
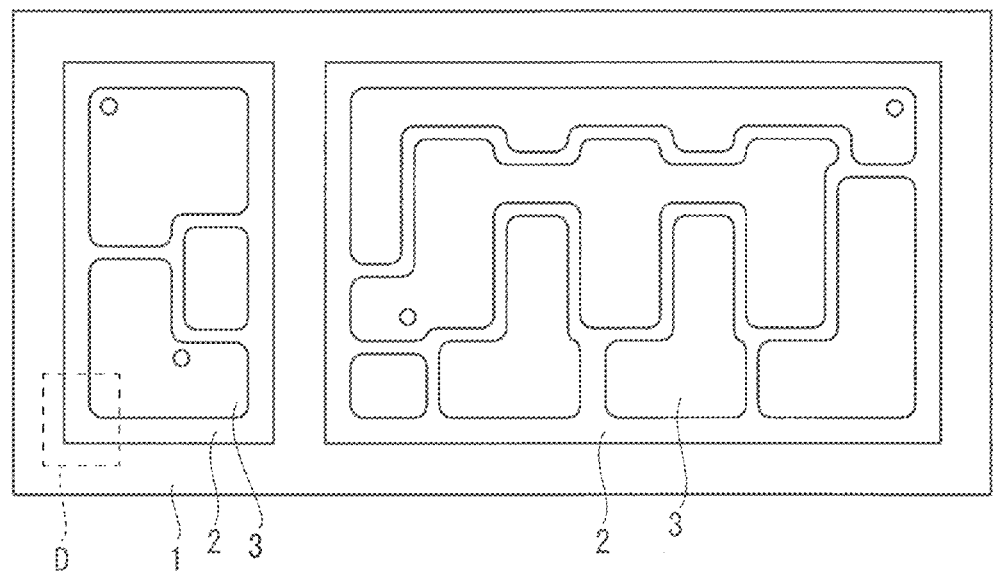
FIG. 1 is a plan view of a semiconductor device according to a first preferred embodiment.
Figure 2:
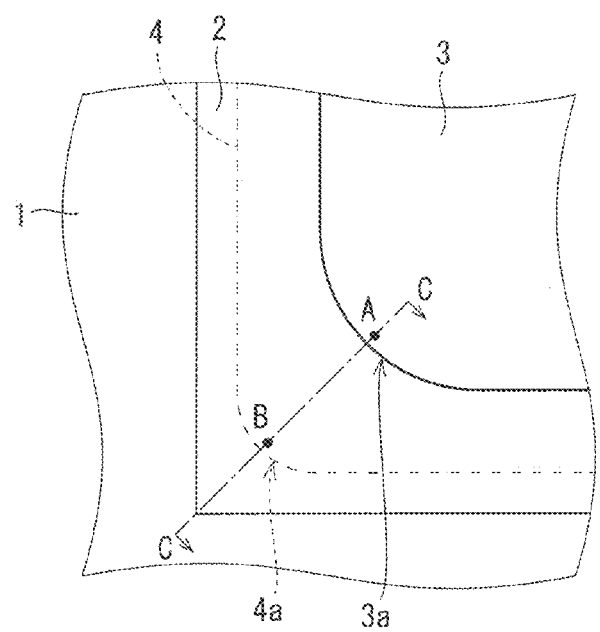
FIG. 2 is a plan view of a corner portion of the semiconductor device according to the first preferred embodiment.

FIG. 1 is a plan view of a semiconductor device according to a first preferred embodiment. FIG. 2 is a plan view of an enlarged region D in FIG. 1.

As shown in FIG. 1, the semiconductor device in the first preferred embodiment includes a heat dissipation plate 1, an insulating substrate 2 disposed on the heat dissipation plate 1 (that is to say, the heat dissipation plate 1 is disposed on a back surface of the insulating substrate 2), and semiconductor elements (not shown) disposed on the insulating substrate 2. A material for the heat dissipation plate 1 (also referred to as a base plate) is copper, for example. The heat dissipation plate 1 is not limited to copper and may be, for example, aluminum as long as heat dissipation properties are satisfied.

A circuit pattern 3 is formed on the front surface (first main surface) of the insulating substrate 2. A back surface pattern 4 (see FIG. 8) is formed on the back surface (second main surface) of the insulating substrate 2. A material for the insulating substrate 2 is aluminum nitride ($Al_2O_3$), for example. A material for the circuit pattern 3 and the back surface pattern 4 is metal. The circuit pattern 3 and the back surface pattern 4 are, for example, made of copper or formed of copper as a main material (that is to say, including copper).

The circuit pattern 3 and the back surface pattern 4 are bonded with a brazing material to the first main surface and the second main surface of the insulating substrate 2, respectively.

The circuit pattern 3 includes the semiconductor elements, which are not shown, bonded to a front surface (namely, a surface opposite to the surface bonded to the first main surface) thereof. Here, the semiconductor elements are semiconductor elements formed of a semiconductor material including a silicon carbide (SiC). The heat dissipation plate 1 is bonded to a surface of the back surface pattern 4 with solder, the surface being opposite to the insulating substrate 2.

In the first preferred embodiment, as shown in FIG. 2, a curvature of a corner portion 3a of the circuit pattern 3 is greater than a curvature of a corner portion 4a of the back surface pattern 4, Also as shown in FIG. 2, the corner portion 3a of the circuit pattern 3 is formed inside the corner portion 4a of the back surface pattern 4 in a plan view. The configuration of the first preferred embodiment can reduce the thermal stress generated and concentrated in the pattern end portions in the four corners of the insulating substrate 2.

Figure 3:
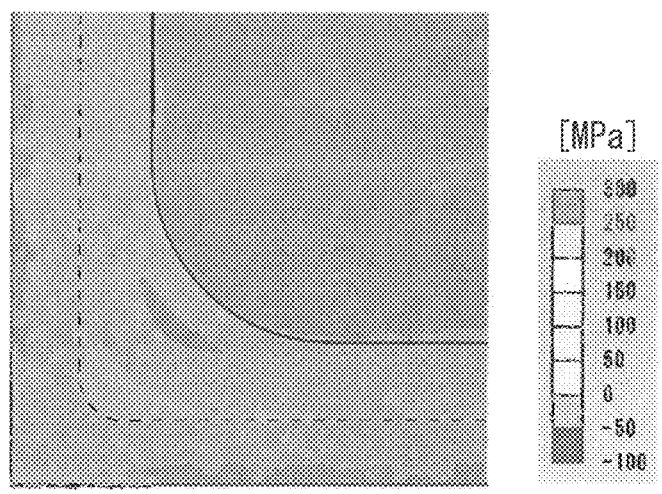
FIG. 3 is a diagram showing a distribution of stress in the corner portion of an insulating substrate of the semiconductor device according to the first preferred embodiment.

FIG. 3 is a diagram showing a distribution of the stress generated in the corner portion of the insulating substrate 2 in the first preferred embodiment when the insulating substrate 2 is bonded to the heat dissipation plate 1. It can be seen that an amount of the stress is approximately 150 MPa in the corner portion.

Figure 4:
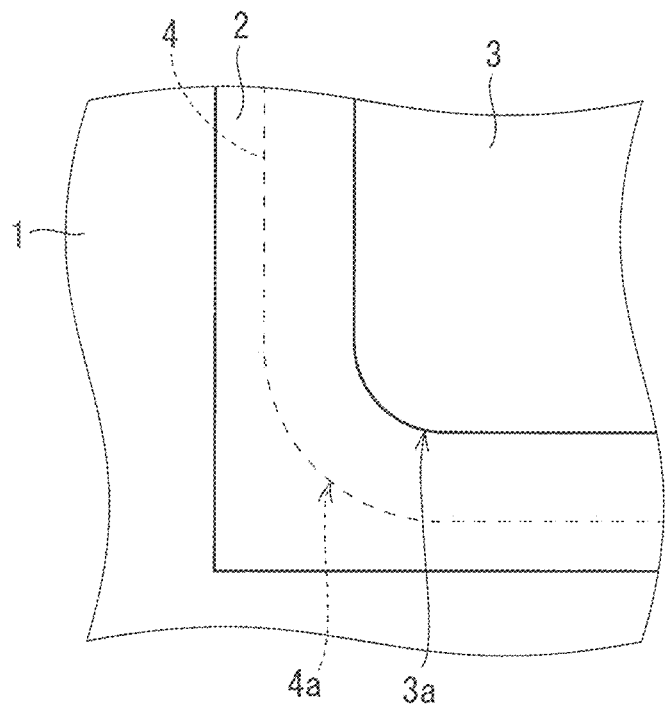
FIG. 4 is a plan view of a corner portion of a semiconductor device in a comparative example.
Figure 5:
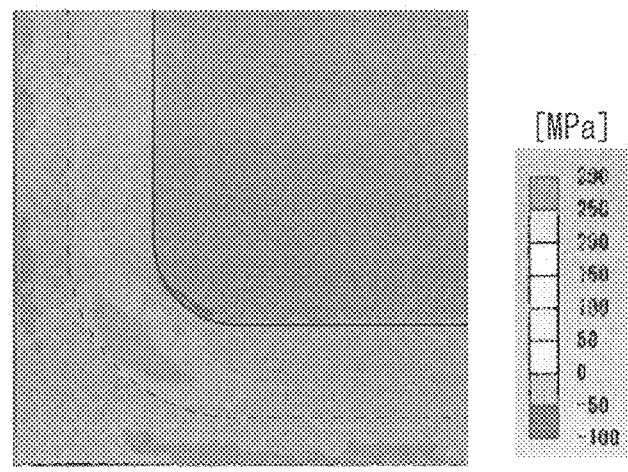
FIG. 5 is a diagram showing a distribution of stress in the corner portion of an insulating substrate of the semiconductor device in the comparative example.

FIG. 4 shows a comparative example for comparing the generation of the stress with the semiconductor device in the first preferred embodiment. In the comparative example shown in FIG. 4, which is the reverse of the first preferred embodiment (FIG. 2), the curvature of the corner portion 3a of the circuit pattern 3 is less than the curvature of the corner portion 4a of the back surface pattern 4. FIG. 5 is a diagram showing a distribution of the stress generated in the corner portion of the insulating substrate 2 in the comparative example when the insulating substrate 2 is bonded to the heat dissipation plate 1. It can be seen that an amount of the stress is approximately 200 MPa in the corner portion.

Figure 6:
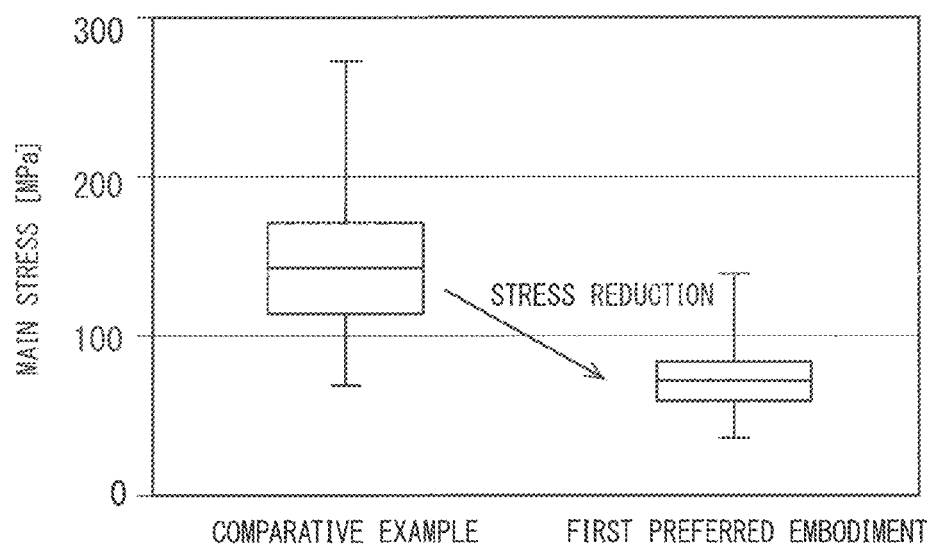
FIG. 6 is a diagram showing a comparison of amounts of the stress generated in the insulating substrates in the first preferred embodiment and the comparative example.

FIG. 6 is a diagram showing a comparison of amounts of the stress generated in the insulating substrate 2 in the first preferred embodiment and the insulating substrate 2 in the comparative example. It can be seen from FIG. 6 that the amount of the stress generated in the insulating substrate 2 in the first preferred embodiment is reduced more than that in the comparative example.

Figure 7:
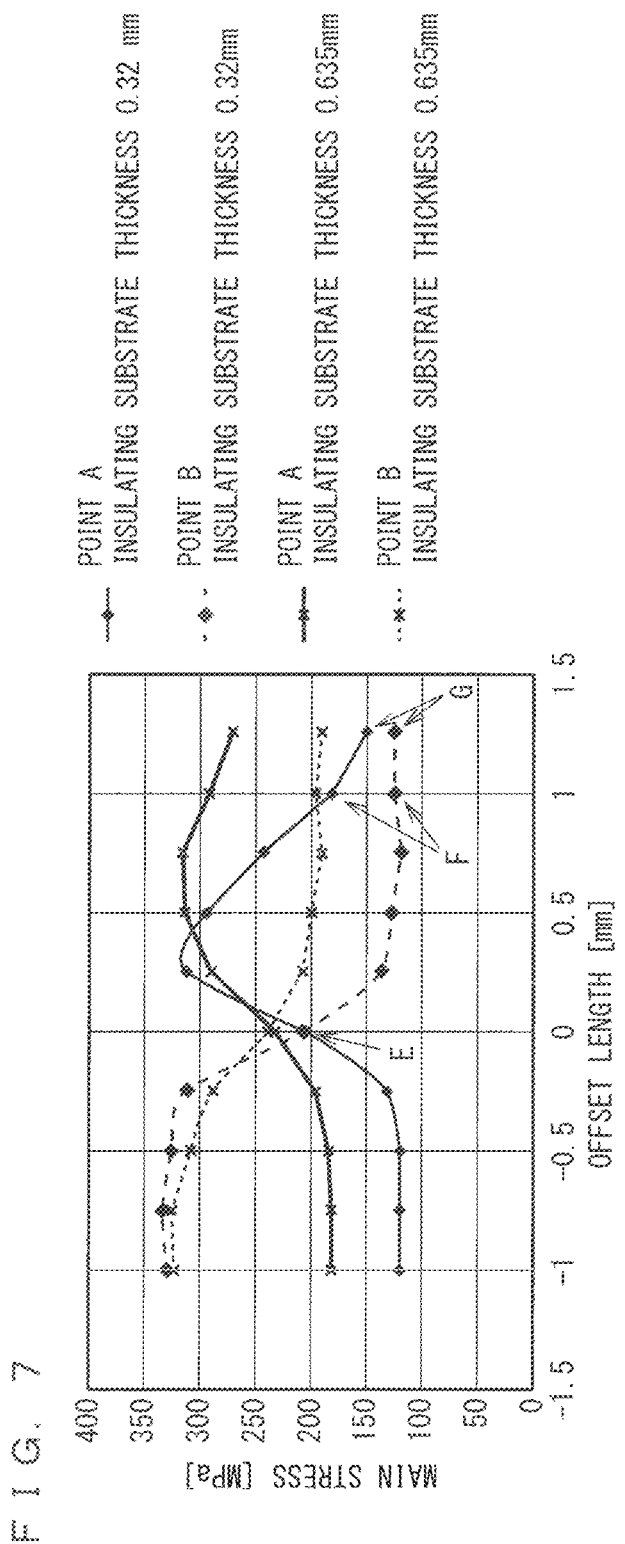
FIG. 7 is a diagram showing a dependence of the stress on an offset length, the stress being generated in the corner portion of the insulating substrate of the semiconductor device according to the first preferred embodiment.
Figure 8:
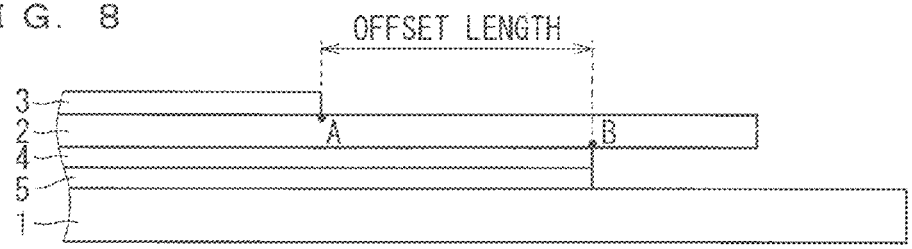
FIG. 8 is a cross-sectional view of the corner portion of the semiconductor device according to the first preferred embodiment.

FIG. 7 is a diagram showing a relationship between the stress generated in the insulating substrate 2 in the first preferred embodiment and an offset length. FIG. 8 is a cross-sectional view taken along a line segment C-C in FIG. 2. The offset length as shown in FIG. 8 represents a distance from a contour of the circuit pattern 3 to a contour of the back surface pattern 4 in the corner portion. FIG. 7 shows an amount of the stress generated in points A, B in each case where a thickness of the insulating substrate 2 is set to 0.32 mm and 0.635 mm. In FIG. 7, to change the offset length, the dimension of the circuit pattern 3 is fixed while the dimensions of the back surface pattern 4 and a solder 5 are changed.

It can be implied, from FIG. 8, as an overall tendency in a range of the offset length greater than or equal to 0 mm that the stress tends to decrease as the thickness of the insulating substrate 2 is reduced from 0.635 mm to 0.32 mm. In other words, the stress can be reduced with the shorter offset length when the insulating substrate 2 has the thinner thickness.

Note the case where the insulating substrate 2 has the thickness of 0.32 mm, it can be seen that the stress in both the points A, B can be reduced with the offset length of 1 mm (data point F in FIG. 7) more than the case where the offset length is 0 mm (data point F in FIG. 7). Furthermore, as shown by a data point G in FIG. 7, the stress can be further reduced by making the offset length longer than 1 mm.

In the first preferred embodiment, the circuit pattern 3 and the back surface pattern 4 may be made of aluminum or formed of aluminum as the main material (that is to say, including aluminum). Also in the first preferred embodiment, the circuit pattern 3 and the back surface pattern 4 are bonded to the insulating substrate 2 with the brazing material but may be directly bonded to the insulating substrate 2. In the first preferred embodiment, the insulating substrate 2 is the aluminum nitride but may be silicon nitride.

<Effects>

The semiconductor device according to the first preferred embodiment includes: the insulating substrate 2; the circuit pattern 3 having a first surface that is bonded to the first main surface of the insulating substrate 2 and a second surface opposite to the first surface on which the semiconductor elements are bonded; the back surface pattern 4 having a first surface that is bonded to the second main surface of the insulating substrate 2; and the heat dissipation plate 1 bonded to a second surface of the back surface pattern 4 opposite to the first surface of the back surface pattern 4. The curvature of the corner portion 3a of the circuit pattern 3 is greater than the curvature of the corner portion 4a of the back surface pattern 4, and the corner portion 3a of the circuit pattern 3 is located inside the corner portion 4a of the back surface pattern 4 in the plan view.

Therefore, in the semiconductor device according to the first preferred embodiment, the curvature of the corner portion 3a of the circuit pattern 3 is greater than the curvature of the corner portion 4a of the back surface pattern 4, and the corner portion 3a of the circuit pattern 3 is located inside the corner portion 4a of the back surface pattern 4 in the plan view. This configuration can reduce the thermal stress generated and concentrated in the corner portion of the insulating substrate 2 more than the case where the offset lengths of the circuit pattern 3 and the back surface pattern 4 are zero. This can further suppress the crack generated in the insulating substrate 2. Thus, yields in manufacturing steps are improved. In other words, productivity is improved. Furthermore, the crack resistance of the insulating substrate 2 is increased, thereby increasing reliability of the semiconductor device.

In the semiconductor device in the first preferred embodiment, the circuit pattern 3 and the back surface pattern 4 include copper. Therefore, the semiconductor device in which conductivity is compatible with assembly characteristics can be achieved by using copper having excellent conductivity as the material for the circuit pattern 3 and the back surface pattern 4.

In the semiconductor device in the first preferred embodiment, the circuit pattern 3 and the back surface pattern 4 may include aluminum. Therefore, the semiconductor device can be manufactured at a lower cost by using aluminum that is a relatively inexpensive material having excellent conductivity and capable of being bonded as the material for the circuit pattern 3 and the back surface pattern 4.

In the semiconductor device in the first preferred embodiment, the circuit pattern 3 and the back surface pattern 4 are bonded to the insulating substrate 2 with the brazing material. Therefore, the bonding with the brazing material can reduce defects in bonded portions.

In the semiconductor device in the first preferred embodiment, the circuit pattern 3 and the back surface pattern 4 may be directly bonded. Therefore, the direct bonding can further reduce the manufacturing cost.

In the semiconductor device in the first preferred embodiment, the insulating substrate 2 is made of aluminum nitride. Therefore, the insulating substrate 2 is made of aluminum nitride, so that the heat dissipation properties can be improved.

In the semiconductor device in the first preferred embodiment, the insulating substrate 2 may be made of silicon nitride. Therefore, the insulating substrate 2 is made of silicon nitride, so that the heat dissipation properties and transverse strength of the insulating substrate 2 can be improved. This can improve a crack resistance of the insulating substrate 2.

In the semiconductor device in the first preferred embodiment, the semiconductor elements are silicon carbide semiconductor elements. Therefore, the semiconductor elements can operate at high temperatures, expanding the operating temperature range of the semiconductor device.

<Second Preferred Embodiment>

Figure 9:
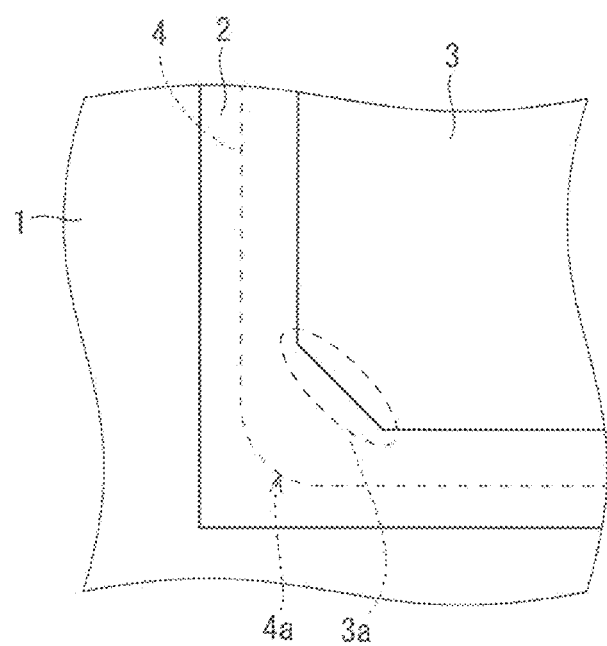
FIG. 9 is a plan view of a corner portion of a semiconductor device according to a second preferred embodiment.

FIG. 9 is a plan view of an enlarged region D in FIG. 1, assuming that FIG. 1 is a semiconductor device in a second preferred embodiment. The corner portion of the circuit pattern 3 in the second preferred embodiment has a shape different from that in the first preferred embodiment (FIG. 2). The other configuration is the same as that in the first preferred embodiment, so that description will be omitted.

As shown in FIG. 9, the corner portion 3a of the circuit pattern 3 in the second preferred embodiment is formed in a polygonal line. In the second preferred embodiment, the corner portion 3a of the circuit pattern 3 has a shape having the corner cut.

Similarly to the first preferred embodiment, the circuit pattern 3 is formed inside the back surface pattern 4 in the plan view.

Figure 10:
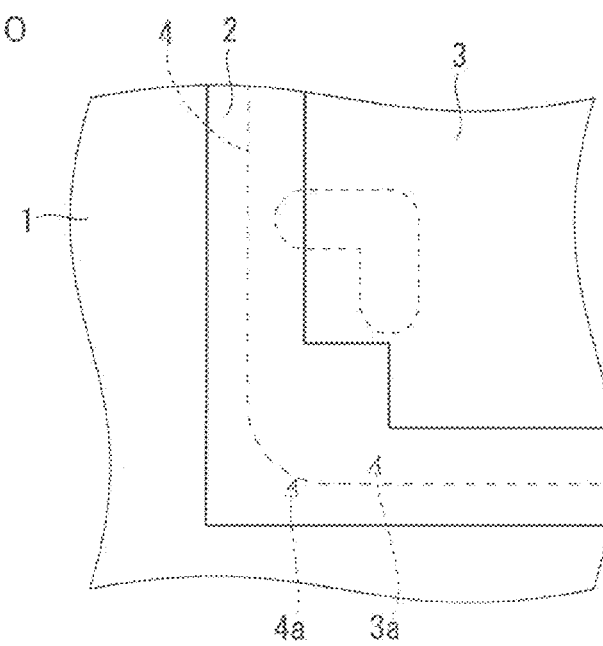
FIG. 10 is a diagram showing another example of the corner portion of the semiconductor device according to the second preferred embodiment.

FIG. 10 is a diagram showing another example of the corner portion 3a of the circuit pattern 3 in the second preferred embodiment. Also in FIG. 10, the corner portion 3a of the circuit pattern 3 is formed in the polygonal line.

<Effects>

The semiconductor device according to the second preferred embodiment includes: the insulating substrate 2; the circuit pattern 3 that is bonded to the first main surface of the insulating substrate 2 and includes the semiconductor elements bonded to the surface opposite to the surface bonded to the first main surface; the back surface pattern 4 bonded to the second main surface of the insulating substrate 2; and the heat dissipation plate 1 bonded to the surface of the back surface pattern 4, the surface being opposite to the surface bonded to the second main surface. The corner portion 3a of the circuit pattern 3 is formed in the polygonal line, and the corner portion 3a of the circuit pattern 3 is located inside the corner portion 4a of the back surface pattern 4 in the plan view.

Therefore, the corner portion 3a of the circuit pattern 3 is formed in the polygonal line, so that flexibility in the design of the circuit pattern 3 is improved and the area of the insulating substrate 2 can be reduced. Thus, the semiconductor device can be miniaturized. The corner portion 3a of the circuit pattern 3 is located inside the corner portion 4a of the back surface pattern 4 in the plan view, so that the crack generated in the insulating substrate 2 can be suppressed.

Thus, yields in manufacturing steps are improved. In other words, productivity is improved. Furthermore, the crack resistance of the insulating substrate 2 is increased, thereby increasing reliability.

In the semiconductor device in the second preferred embodiment, the circuit pattern 3 and the back surface pattern 4 include copper. Therefore, the semiconductor device in which conductivity is compatible with assembly characteristics can be achieved by using copper having excellent conductivity as the material for the circuit pattern 3 and the back surface pattern 4.

In the semiconductor device in the second preferred embodiment, the circuit pattern 3 and the back surface pattern 4 may include aluminum. Therefore, the semiconductor device can be manufactured at a lower cost by using aluminum that is a relatively inexpensive material having excellent conductivity and capable of being bonded as the material for the circuit pattern 3 and the back surface pattern 4.

In the semiconductor device in the second preferred embodiment, the circuit pattern 3 and the back surface pattern 4 are bonded to the insulating substrate 2 with the brazing material. Therefore, the bonding with the brazing material can reduce defects in bonded portions.

In the semiconductor device in the second preferred embodiment, the circuit pattern 3 and the back surface pattern 4 may be directly bonded. Therefore, the direct bonding can further reduce the manufacturing cost.

In the semiconductor device in the second preferred embodiment, the insulating substrate 2 is made of aluminum nitride. Therefore, the insulating substrate 2 is made of aluminum nitride, so that the heat dissipation properties can be improved.

In the semiconductor device in the second preferred embodiment, the insulating substrate 2 may be made of silicon nitride. Therefore, the insulating substrate 2 is made of silicon nitride, so that the heat dissipation properties and transverse strength of the insulating substrate 2 can be improved. This can improve a crack resistance of the insulating substrate 2.

In the semiconductor device in the second preferred embodiment, the semiconductor elements are silicon carbide semiconductor elements. Therefore, the semiconductor elements can operate at high temperatures, expanding the operating temperature range of the semiconductor device.

<Third Preferred Embodiment>

Figure 11:
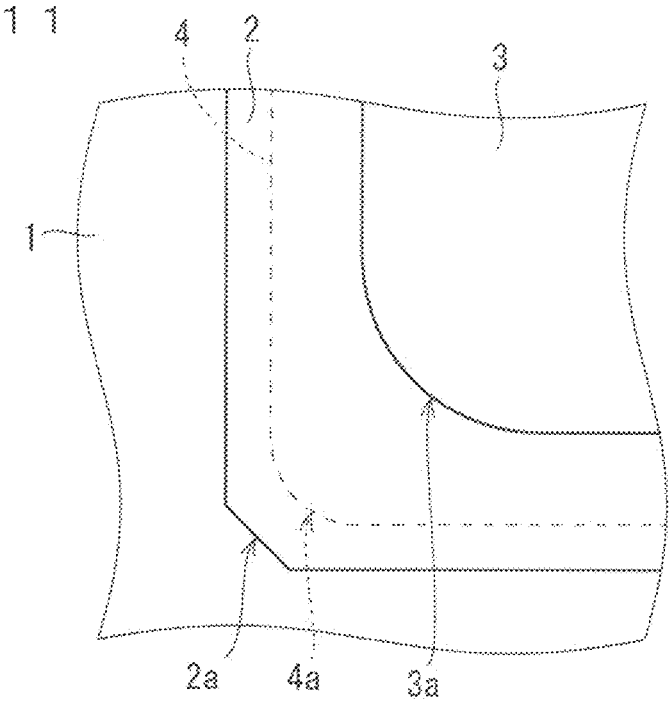
FIG. 11 is a plan view of a corner portion of a semiconductor device according to a third preferred embodiment.

FIG. 11 is a plan view of an enlarged region D in FIG. 1, assuming that FIG. 1 is a semiconductor device in a third preferred embodiment. A corner portion 2a of the insulating substrate 2 in the third preferred embodiment has a shape different from that in the first preferred embodiment (FIG. 2). The other configuration is the same as that in the first preferred embodiment, so that description will be omitted.

As shown in FIG. 11, the corner portion 2a of the insulating substrate 2 in the third preferred embodiment has a shape having the corner cut.

Therefore, the corner portion 2a of the insulating substrate 2 has the corner cut, so that the area of the insulating substrate 2 can be reduced. Thus, miniaturization of the semiconductor device can be achieved in addition to the effects described in the first preferred embodiment.

<Fourth Preferred Embodiment>

Figure 12:
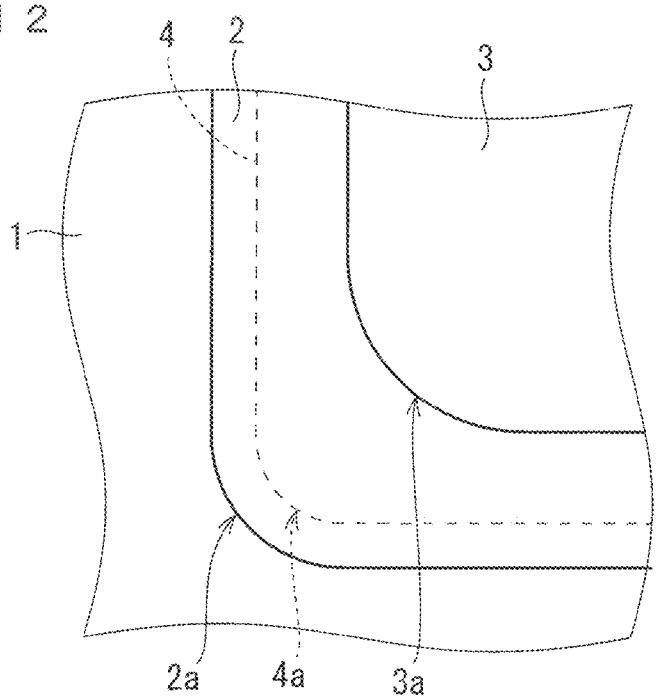
FIG. 12 is a plan view of a corner portion of a semiconductor device according to a fourth preferred embodiment.

FIG. 12 is a plan view of an enlarged region D in FIG. 1, assuming that FIG. 1 is a semiconductor device in a fourth preferred embodiment. The corner portion 2a of the insulating substrate 2 in the fourth preferred embodiment has a shape different from that in the first preferred embodiment (FIG. 2). The other configuration is the same as that in the first preferred embodiment, so that description will be omitted.

As shown in FIG. 12, the corner portion 2a of the insulating substrate 2 in the fourth preferred embodiment has a curved outline.

Therefore, the corner portion 2a of the insulating substrate 2 has the curved outline, so that the effects of reducing the stress described in the first preferred embodiment can be further improved. Thus, the crack resistance of the insulating substrate 2 is further increased, so that reliability of the semiconductor device is further increased.

In addition, according to the present invention, the above preferred embodiments can be arbitrarily combined, or each preferred embodiment can be appropriately varied or omitted within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
   an insulating substrate;
   a circuit pattern having a first surface that is bonded to a first main surface of said insulating substrate and a second surface opposite to said first surface on which a semiconductor element is bonded;
   a back surface pattern having a first surface that is bonded to a second main surface of said insulating substrate; and
   a heat dissipation plate bonded to a second surface of said back surface pattern opposite to said first surface of said back surface pattern, wherein
   a curvature of a corner portion of said circuit pattern is greater than a curvature of a corner portion of said back surface pattern, and
   the corner portion of said circuit pattern is located inside the corner portion of said back surface pattern in a plan view,
   wherein the insulating substrate has a removed corner portion.

2. The semiconductor device according to claim 1, wherein the corner portion of said insulating substrate has a corner cut.

3. The semiconductor device according to claim 1, wherein the corner portion of said insulating substrate has a curved outline.

4. The semiconductor device according to claim 1, wherein said circuit pattern and said back surface pattern include copper.

5. The semiconductor device according to claim 1, wherein said circuit pattern and said back surface pattern include aluminum.

6. The semiconductor device according to claim 1, wherein said circuit pattern and said back surface pattern are bonded to said insulating substrate with a brazing material.

7. The semiconductor device according to claim 1, wherein said circuit pattern and said back surface pattern are directly bonded to said insulating substrate.

8. The semiconductor device according to claim 1, wherein said insulating substrate is made of aluminum nitride.

9. The semiconductor device according to claim 1, wherein said insulating substrate is made of silicon nitride.

10. The semiconductor device according to claim 1, wherein said semiconductor element is a silicon carbide semiconductor element.

11. A semiconductor device, comprising:
    an insulating substrate;
    a circuit pattern that is bonded to a first main surface of said insulating substrate and includes a semiconductor element bonded to a surface opposite to the surface bonded to said first main surface;
    a back surface pattern bonded to a second main surface of said insulating substrate; and
    a heat dissipation plate bonded to a surface of said back surface pattern, the surface being opposite to a surface bonded to said second main surface, wherein
    a corner portion of said circuit pattern is formed in a polygonal line, and
    the corner portion of said circuit pattern is located inside a corner portion of said back surface pattern in a plan view.

12. The semiconductor device according to claim 11, wherein the corner portion of said insulating substrate has a corner cut.

13. The semiconductor device according to claim 11, wherein the corner portion of said insulating substrate has a curved outline.

14. The semiconductor device according to claim 11, wherein said circuit pattern and said back surface pattern include copper.

15. The semiconductor device according to claim 11, wherein said circuit pattern and said back surface pattern include aluminum.

16. The semiconductor device according to claim 11, wherein said circuit pattern and said back surface pattern are bonded to said insulating substrate with a brazing material.

17. The semiconductor device according to claim 11, wherein said circuit pattern and said back surface pattern are directly bonded to said insulating substrate.

18. The semiconductor device according to claim 11, wherein said insulating substrate is made of aluminum nitride.

19. The semiconductor device according to claim 11, wherein said insulating substrate is made of silicon nitride.

20. The semiconductor device according to claim 11, wherein said semiconductor element is a silicon carbide semiconductor element.

* * * * *